United States Patent [19]

Abdoo

[11] 4,081,694
[45] Mar. 28, 1978

[54] CIRCUIT FOR DETECTING THE OCCURRENCE OF A PREDETERMINED INPUT FREQUENCY

[75] Inventor: Richard V. Abdoo, Livonia, Mich.

[73] Assignee: Ford Motor Company, Dearborn, Mich.

[21] Appl. No.: 716,866

[22] Filed: Aug. 23, 1976

[51] Int. Cl.² ........................................... H01H 47/20
[52] U.S. Cl. ................................................. 307/129
[58] Field of Search .......... 307/125, 129, 232, 233 R, 307/233 A, 233 B, 234, 247 R; 361/182, 240; 340/262, 263; 235/92 FQ, 92 TF

[56] References Cited

U.S. PATENT DOCUMENTS 3,914,619 10/1975 Talmage et al. ..................... 307/129

Primary Examiner—Robert K. Schaefer
Assistant Examiner—Eugene S. Indyk
Attorney, Agent, or Firm—Robert W. Brown; Clifford L. Sadler

[57] ABSTRACT

A frequency responsive switching circuit that, in the preferred form, includes circuit means for generating a periodic first electrical signal. The first electrical signal is applied to a retriggerable monostable multivibrator having as its output a second electrical signal. A timing circuit associated with the retriggerable monostable multivibrator controls the duration of the output pulses constituting the second electrical signal. If the period of the first electrical signal is less than a predetermined amount, the second electrical signal is maintained at a fixed voltage level due to continuous retriggering of the multivibrator. The second electrical signal is applied to the data input of a shift register and the first electrical signal is supplied to the shift register as a trigger input. Multiple bit outputs of the shift register form the inputs to a gate circuit. If the second electrical signal is maintained at the fixed voltage level for a plurality of periods of the first electrical signal, then the gate circuit produces an output signal indicative of this circumstance. Thus, if the period of the first electrical signal, for a plurality of its cycles, is below a predetermined amount of time, an output signal is produced.

6 Claims, 1 Drawing Figure

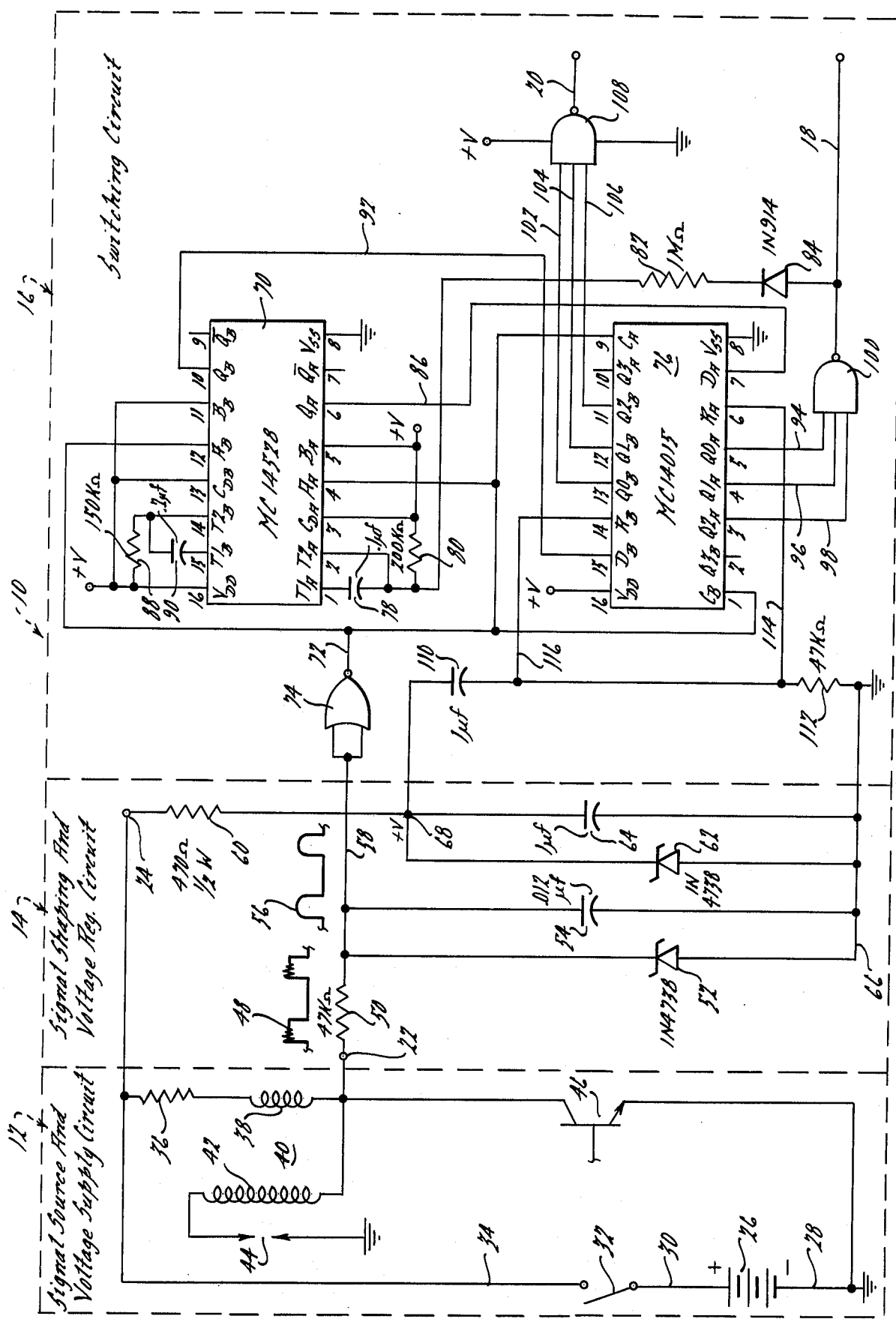

CIRCUIT FOR DETECTING THE OCCURRENCE OF A PREDETERMINED INPUT FREQUENCY

BACKGROUND OF THE INVENTION

This invention relates to a frequency responsive switching circuit. More particularly, the invention relates to a frequency responsive switching circuit that may be used to produce a switched signal when the RPM of a rotating shaft, such as the crankshaft of a vehicle engine, reaches a predetermined level. Hysteresis may be provided to change the RPM level at which the circuit output is switched once again to its original condition.

The present invention may be used in an engine control system such as that described in my concurrently filed and commonly assigned patent application Ser. No. 716,865, filed Aug. 23, 1976 and entitled "Circuit for Controlling the Operability of One or more Cylinders of a Multicylinder Internal Combustion Engine."

There are numerous situations in which it is desired to provide a switched output signal when the frequency of a periodically varying parameter has reached a predetermined level or fallen below such level. An example of another frequency responsive switching circuit utilized in this manner is described in U.S. Pat. No. 3,914,619, issued Oct. 21, 1975 to Dennis D. Talmage et al. The circuit described in the above patent is utilized in controlling the position of a throttle mechanism on an internal combustion engine.

SUMMARY OF THE INVENTION

In accordance with the invention, a frequency responsive switching circuit includes circuit means for generating a first-electrical signal, the first electrical signal having a characteristic that changes repetitively from a first condition to a second condition. Circuit means, responsive to this first electrical signal, are provided for generating a second electrical signal. The second electrical signal has a characteristic that changes from a first condition to a second condition and then back to its first condition in response to a change of the first electrical signal from its first condition to its second condition if the time between the changes of the first electrical signal exceeds a predetermined amount. The second electrical signal, once in its second condition, is maintained in this second condition as long as the time between the changes of the first electrical signal is less than the predetermined amount.

Third circuit means, responsive to the first and second electrical signals, are provided for generating a third electrical signal. The third electrical signal has a characteristic that has a first condition when the time between the changes of the first electrical signal exceeds the aforementioned predetermined amount and has a second condition when a plurality of the changes of the first electrical signal have occurred during a time period that the second electrical signal is maintained in its second condition.

The invention may be better understood by reference to the detailed description which follows and to the drawing.

BRIEF DESCRIPTION OF THE DRAWING

The drawing is a schematic electrical diagram of a frequency responsive switching circuit designed for use with a spark ignition internal combustion engine to produce two switched output signals, each at a different engine angular velocity, indicative of the engine having achieved these respective crankshaft angular velocities. The drawing also illustrates certain electrical components conventionally found on an internal combustion engine of the spark ignition type, which are useful as a signal source indicative of engine RPM.

DETAILED DESCRIPTION

With reference now to the drawing, there is shown a frequency responsive switching circuit and associated electrical components conventionally found on a spark-ignition internal combustion engine, this circuitry being generally designated by the numeral 10. The circuit 10 includes a signal source and voltage supply circuit 12, a signal shaping and voltage regulation circuit 14, and a switching circuit 16. The broken lines in the drawing enclose the circuits 12, 14 and 16.

The circuit 10 is designed to provide, at its output terminals 18 and 20 in the switching circuit 16, signals indicative of engine operation at angular velocities above or below predetermined levels. Specifically, the signal on output lead 18 is intended to be at a logic one voltage level when the RPM of a six-cylinder spark-ignition engine is less than 1700 RPM and is switch to a logic zero voltage level when the engine RPM exceeds 1700, and a hysteresis circuit is provided so that the logic one level does not recur unless the engine speed falls below 1500 RPM. The signal on output lead 20 is intended to produce a logic one voltage level when the engine speed is less than 950 RPM and is intended to reach a logic zero voltage level when the engine speed exceeds 950 RPM. There is no provision for hysteresis with respect to the RPM switching level of the signal on output lead 20.

The circuits 14 and 16 may be included in a single module having input terminals 22 and 24. The circuit 12 includes components that are conventionally associated with spark ignition internal combustion engines in motor vehicles. Specifically, the signal source and voltage supply circuit 12 includes a DC source of electrical energy 26, which preferably is a conventional 12-volt storage battery, having a negative lead connected at 28 to ground and having a positive lead 30 that is connected to one pole of an ignition switch 32. When the ignition switch 32 is closed, an unregulated voltage appears on lead 34 connected to the opposite pole of the ignition switch. The voltage on lead 34 is applied to input terminal 24 of the circuit 14 and also is supplied, through a ballast resistor 36, to the primary winding 38 of an ignition coil 40 having a secondary winding 42 connected through a distributor (not shown) to the various spark gaps 44 formed between the electrodes of the engines spark plugs. The ballast resistor 36, the primary winding 38, and the collector-emitter circuit of a transistor 46 are connected in series across the voltage supply leads 34 and 28. The transistor 46 is the output semiconductor switching device found in inductive, transistorized ignition systems now conventionally used in motor vehicles.

The junction between the collector of the transistor 46 and the primary winding 38 of the ignition coil is connected to the input terminal 22 of the circuit 14. As the transistor 46 switches between conductive and non-conductive states during engine operation, the signal 48 appears at terminal 22. When the transistor 46 is conductive, the terminal 22 is at nearly ground potential, and when the transistor 46 becomes non-conductive, the potential at terminal 22 stabilizes at the voltage on supply lead 34 after some ringing that occurs from the rise of the pulse due to the inductive characteristics of the ignition system. The pulse repetition frequency of the signal 48 is directly proportional to engine speed and, hence, the period of this cyclically varying signal is inversely proportional to engine speed, that is, the period of the signal 48 decreases as the engine speed increases.

A resistor 50 is connected in series with the parallel combination of a zener diode 52 and a capacitor 54. The zener diode 52 may have a reverse breakdown voltage of, for example, 10 volts and a signal 56, having the pulse repetition frequency of the signal 48, appears on the output lead 58 of the signal shaping and voltage regulation circuit 14. The circuit 14 includes voltage regulation means in the form of a resistor 60 connected in series with the parallel combination of a zener diode 62 and a capacitor 64, these elements being connected across the voltage supply lead 34 and a ground lead 66 having the potential of ground lead 28. As a result, a voltage $+V$ that is regulated by the zener diode 62 and the filter capacitor 64 appears at the junction 68 formed between these components and the resistor 60. This regulated voltage is used to supply various components within the switching circuit 16, as indicated in the drawing.

The circuit 16 includes a Motorola MC14528 dual monostable multivibrator 70. This dual, retriggerable, resettable monostable multivibrator is triggered by the positive-going edges of pulses applied to its trigger inputs $A_A$ and $A_B$ via lead 72, which is the output lead from an inverter 74, that inverts the pulse signals 56 appearing on lead 58. The subscripts A and B correspond, respectively, to the two monostable multivibrators in the package 70. Thus, each multivibrator vibrator receives pulses on lead 72 having a frequency proportional to engine RPM.

The circuit 16 also includes a Motorola MC14015 dual four-bit static shaft register 76. The subscripts A and B associated with the shift register 76 correspond, respectively, to each of the four-bit static shift registers in the package 76. These identical shift registers are of the serial-input/parallel-output type and each shift register has independent clock (C) and reset (R) inputs with a single serial data (D) input. Data is shifted from one stage to the next during the positive-going clock transition, and each register can be cleared with a logic one level signal applied to its reset terminal.

One of the monostable multivibrators in the package 70 has timing components, including a capacitor 78, a resistor 80, a resistor 82, and a blocking diode 84, that determine the duration of the output impulse appearing on its output lead 86. This output lead 86 is connected between the $Q_A$ output of the multivibrator 70 and the data input $D_A$ of one of the shift registers in the package 76. When the output signal on lead 18 is at a logic one voltage level, substantially equal to the supply voltage $+V$, the diode 84 is forward biased and the resistor 82 and diode 84 are connected in parallel with the resistor 80. On the other hand, when the voltage on output lead 18 is low or at ground potential (a logic zero level), the diode 84 is reverse-biased and the timing circuit for the associated monostable multivibrator in the package 70 effectively includes only the resistor 80 and the capacitor 78, which increases the duration of the $Q_A$ output pulse appearing on lead 86.

The timing circuit associated with the second monostable multivibrator in the package 70 includes a resistor 88 and a capacitor 90. The output pulses appear on lead 92 interconnecting the $Q_B$ output of the package 70 with the data input $D_B$ of the second shift register in the package 76.

Leads 94, 96 and 98 connect, respectively, the $Q0_A$ $Q1_A$ and $Q2_A$ bit outputs from one of the shift registers in the package 76 to a NAND-gate 100 having the output lead 18. Similarly, the leads 102, 104 and 106 connect, respectively, the $Q0_B$, $Q1_B$ and $Q2_B$ bit output leads from the other shift register in the package 76 to the inputs of a NAND-gate 108 having the output lead 20. A capacitor 110 is connected in series with a resistor 112, and these components are connected between the $+V$ supply voltage appearing at junction 68 and ground potential on lead 66. The junction between the capacitor 110 and the resistor 112 is connected by leads 114 and 116 to the respective reset terminals $R_A$ and $R_B$ of the dual shift register package 76.

With respect to the operation of the switching circuit 16, let it be assumed that the ignition switch 32 is initially open as shown and that the engine with which the circuit 12 is associated is not running. Upon closure of the ignition switch 32 and starting of the engine, pulses begin to appear on the lead 72 in the circuit 16. These pulses have a frequency directly proportional to engine speed and a period inversely proportional thereto. The closure of the ignition switch 32 produces the $+V$ voltage at junction 68 and, because the capacitor 110 initially is discharged, the same voltage initially appears on leads 114 and 116 to reset the dual shift registers in the package 76 so that the bit outputs on leads 94, 96, 98, 102, 104 and 106 are at logic zero levels. The capacitor 110 charges through the resistor 112 and, thereafter, leads 114 and 116 are maintained at ground potential.

As the engine speed increases, the period of the pulses on lead 72 decreases. The positive going edge of each pulse thereon retriggers both of the monostable multivibrators in the package 70. With the timing circuit component values indicated in the drawing for the B-multivibrator in the package 70, the signal on lead 92 that is applied to the $D_B$ input of the B-shift register in the package 76 is always at a logic zero level when the positive going edge of a pulse on lead 72 is applied to the $C_B$ input of this shift register, provided that the engine speed is less than 950 RPM. This occurs because the timing circuit components 88 and 90 produce a pulse duration on lead 92 that is less than the period of the input signal appearing on lead 72 and, hence a logic zero level signal is transferred from the $D_B$ input of the B-shift register in the package 76 to its $Q0_B$ location each time a pulse appears on the lead 72. As a result, leads 102, 104 and 106 have logic zero level signals on them, and the output lead 20 has a logic one level signal on it, as long as the engine RPM is less than 950.

When the engine speed exceeds 950 RPM, the pulses appearing on lead 72 retrigger the B-monostable multivibrator before the timing components 88 and 90 permit termination of the high voltage level of the signal on lead 92, which lead therefore is maintained at a logic one level at engine speeds above 950 RPM. After three positive-going edges have appeared on lead 72, the logic one level signal on lead 92 will have been shifted by the B-shift register in the package 76 to its $Q0_B$, $Q1_B$ and $Q2_B$ outputs so that logic one level signals appear on leads 102, 104 and 106. This causes a logic zero level signal to appear on the switching circuit output lead 20.

With the timing circuit components 78, 80, 82 and 84 associated with the A-monostable multivibrator in the package 70 and with the engine speed less than 1700 RPM, the duration of the pulses appearing on lead 86 is less than the period of the signal appearing on lead 72. However, at engine speeds in excess of 1700 RPM, the A-monostable multivibrator in the package 70 is retriggered at a frequency that results in the lead 86 being maintained at a logic one level. As a result, the $D_A$ input in the A-shift register of the package 76 remains at a logic one level, and, upon the occurrence of three positive-going edges of the pulses appearing on lead 72, which are applied to the clock input $C_A$, logic one level signals appear on leads 94, 96 and 98. This causes the appearance of a logic zero level signal on the lead 18. When the logic zero level signal appears on lead 18, the diode 84 is reverse-biased and this diode and the resistor 82 effectively are removed from the timing circuit associated with the A-monostable multivibrator of the package 70 so that the engine speed then must fall below 1500 RPM in order for the output signal on lead 18 to once again reach a logic one level. Thus, the components 84 and 82 perform a hysteresis function with regard to the timing circuitry associated with the A-monostable multivibrator in the package 70 and, hence, with regard to the frequency of the signal at input terminal 22 that is required to produce a switching action at output lead 18.

It should be noted that the leads 86 and 92 must be maintained at logic one levels for three positive-going edges of the signal appearing on lead 72 in order for the respective output leads 18 and 20 to change from a logic one level to a logic zero level. However, only one logic zero level signal on the lead 86 or 92 is required to cause the signal of the associated output leads 18 or 20, respectively, to change from the logic zero level to the logic one level. This is because the positive-going edge of a pulse on lead 72 causes the logic zero level on either of leads 86 and 92 to transfer a logic zero level bit into the $Q0_A$ or $Q0_B$ bit outputs of the package 76. Any logic zero signal on the leads 94, 96 or 98 results in a logic one level at output lead 18 and, similarly, any logic zero level signal on the leads 102, 104 or 106 produces a logic one level signal on output lead 20.

The circuit component values and type numbers are provided to exemplify, but not to limit, the invention. Various circuit modifications may be made without departing from the spirit and scope of the invention. For example, if the input signal 48 is characterized by excessive ringing or high voltage spikes, it may be desirable to connect a zener diode between terminal 22 and resistor 50 to prevent the occurrence of false trigger signals on leads 58 and 72. If such a zener diode is used, a resistor or other means may be connected in parallel with zener diode 52 and capacitor 54 to couple lead 58 to ground potential when the added zener diode is in a nonconductive state.

What is claimed is:

1. A frequency responsive switching circuit, which comprises:

circuit means for generating a periodic first electrical signal;

circuit means, comprising a retriggerable monostable multivibrator having a trigger input responsive to said first electrical signal, for generating a second electrical signal, said second electrical signal appearing at an output of said retriggerable monostable multivibrator and having a voltage that varies from a first level to a second level and then back to its first level if the period of said first electrical signal exceeds a predetermined amount of time, and said second electrical signal, once at its second voltage level, being maintained at said second voltage level if the period of said first electrical signal is less than said predetermined amount of time; and circuit means, responsive to said first and second electrical signals, for generating a third electrical signal, said third electrical signal having a first voltage level if the period of said first electrical signal exceeds said predetermined amount of time and having a second voltage level if a plurality of periods of said first electrical signal occur during a time period that said second electrical signal is maintained at its second voltage level.

2. A frequency responsive switching circuit, which comprises:

circuit means for generating a first electrical signal, said first electrical signal having a characteristic that changes repetitively from a first condition to a second condition;

circuit means, responsive to said first electrical signal, for generating a second electrical signal, said secodn electrical signal having a characteristic that changes from a first condition to a second condition and then back to its first condition in response to a change of said characteristic of said first electrical signal from its first condition to its second condition if the time between said changes of said characteristic of said first electrical signal is less than said predetermined amount; and circuit means, responsive to said first and second electrical signals and comprising a shift register, for generating a third electrical signal, said third electrical signal having a characteristic that has a first condition if the time between said changes of said characteristic of said first electrical signal exceeds said predetermined amount and that has a second condition if a plurality of said changes of said characteristic of said first electrical signal occur during a time period that said characteristic of said second electrical signal is maintained in tis second condition.

3. A frequency responsive switching circuit, which comprises:

circuit means for generating a periodic first electrical signal;

circuit means, responsive to said first electrical signal, for generating a second electrical signal, said second electrical signal having a voltage that varies from a first level to a second level and then back to its first level if the period of said first electrical signal exceeds a predetermined amount of time, and said second electrical signal, once at its second voltage level, being maintained at said second voltage level if the period of said first electrical signal is less than said predetermined amount of time; and circuit means, responsive to said first and second electrical signals, for generating a third electrical signal, said third electrical signal having a first voltage level if the period of said first electrical signal exceeds said predetermined amount of time and having a second voltage level if a plurality of periods of said first electrical signal occur during a time period that said second electrical signal is maintained at its second voltage level, said circuit means for generating said third electrical signal comprising a multiple-bit shift register having a data input coupled to said circuit means for generating said second electrical signal, a clock input coupled to said means for generating said first electrical signal and a plurality of bit outputs to which electrical signals appearing at said data input are serially transferred upon the occurrence of pulses at said clock input, and wherein said third circuit means includes a gate circuit, said gate circuit having a plurality of inputs coupled to a plurality of said bit outputs of said shift register and having an output at which said third electrical signal appears.

4. A frequency responsive switching circuit according to claim 3 which includes hysteresis circuit means for maintaining said second electrical signal at its second voltage level, once said period of said first electrical signal is less than said predetermined amount of time, as long as the period of said first electrical signal is less than a second predetermined amount of time which is greater than said first-mentioned predetermined amount of time.

5. A frequency responsive switching circuit according to claim 3 wherein said circuit means for generating said second electrical signal comprises a retriggerable monostable multivibrator.

6. A frequency responsive switching circuit according to claim 4 wherein said second circuit means comprises a retriggerable monostable multivibrator having an associated timing circuit and wherein said hysteresis circuit means comprises a portion of said timing circuit, said hysteresis circuit means being coupled between said output of said gate circuit and said retriggerable monostable multivibrator to modify the timing function of said timing circuit in response to a change in the electrical logic level at said output of said gate circuit.

* * * * *